US010312083B2

(12) United States Patent
Liang et al.

(10) Patent No.: US 10,312,083 B2
(45) Date of Patent: Jun. 4, 2019

(54) METHOD FOR SELECTIVE EPITAXIAL GROWTH OF A GROUP III-NITRIDE LAYER

(71) Applicant: IMEC VZW, Leuven (BE)

(72) Inventors: Hu Liang, Leuven (BE); Yoganand Saripalli, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/849,579

(22) Filed: Dec. 20, 2017

(65) Prior Publication Data

US 2018/0211837 A1    Jul. 26, 2018

(30) Foreign Application Priority Data

Dec. 21, 2016    (EP) .................................. 16205622

(51) Int. Cl.
*H01L 21/02*    (2006.01)
*H01L 29/66*    (2006.01)
(Continued)

(52) U.S. Cl.
CPC .... *H01L 21/02639* (2013.01); *H01L 21/0254* (2013.01); *H01L 21/02458* (2013.01); *H01L 21/02499* (2013.01); *H01L 21/02576* (2013.01); *H01L 21/02579* (2013.01); *H01L 21/02661* (2013.01); *H01L 29/66431* (2013.01); *H01L 29/7786* (2013.01); *H01L 29/0653* (2013.01);
(Continued)

(58) Field of Classification Search
CPC ........................ H01L 21/0254; H01L 21/0262
See application file for complete search history.

(56) References Cited

U.S. PATENT DOCUMENTS

| 2010/0330754 A1 | 12/2010 | Hebert |
| 2012/0295428 A1 | 11/2012 | Melnik et al. |
| 2016/0043273 A1 | 2/2016 | Horie et al. |

FOREIGN PATENT DOCUMENTS

| EP | 2602827 B1 | 2/2016 |
| WO | 02/01608 A2 | 1/2002 |

OTHER PUBLICATIONS

European Search Report, European Patent Application No. 16205622.0, dated Jun. 6, 2017, 10 pages.
(Continued)

*Primary Examiner* — Walter H Swanson
(74) *Attorney, Agent, or Firm* — McDonnell Boehnen Hulbert & Berghoff LLP (57) ABSTRACT

An example embodiment includes method for forming a layer of a Group III-Nitride material. The method includes providing a substrate having a main surface comprising a layer of a first Group III-nitride material. The substrate further includes, on the main surface, a dielectric layer comprising an opening exposing the first Group III-nitride material. A thermal treatment process is performed while subjecting the substrate to a gas mixture comprising a nitrogen containing gas, thereby increasing temperature of the substrate up to a temperature for growing a layer of a second Group III-nitride material. At least one Group III-metal organic precursor gas is subsequently introduced into the gas mixture at the growth temperature, thereby forming, at least in the opening on the exposed Group III-nitride material, a layer of the second Group III-nitride material by selective epitaxial growth, characterized in that the gas mixture is free of hydrogen gas.

7 Claims, 4 Drawing Sheets

(51) Int. Cl.
    *H01L 29/778*     (2006.01)
    *H01L 29/20*     (2006.01)
    *H01L 29/417*     (2006.01)
    *H01L 29/06*     (2006.01)

(52) U.S. Cl.
    CPC .... *H01L 29/2003* (2013.01); *H01L 29/41766* (2013.01)

(56) References Cited

OTHER PUBLICATIONS

Gibart, Pierre et al., "Chapter 2. Epitaxial Lateral Overgrowth of GaN", Nitride Semiconductors: Handbook on Materials and Devices, Wiley, Jan. 2006, pp. 45-106.

METHOD FOR SELECTIVE EPITAXIAL GROWTH OF A GROUP III-NITRIDE LAYER

CROSS-REFERENCE TO RELATED APPLICATIONS

The present application is a non-provisional patent application claiming priority to European Patent Application No. 16205622.0, filed Dec. 21, 2016, the contents of which are hereby incorporated by reference.

FIELD OF THE DISCLOSURE

The present disclosure is related to the field of growth of a layer of a Group III-nitride material. More specifically, it is related to a method for growing a Group III-nitride layer by selective epitaxial growth on a substrate and structures manufactured thereof.

BACKGROUND

Selective epitaxial growth (SEG) provides growing of semiconductor layers locally through a patterned dielectric mask layer. Selective epitaxial growth of layers is particularly interesting in semiconductor industry. This is due to the fact that, in the manufacturing of semiconductor devices, depending on the layer to be grown and on the device to be manufactured, selective epitaxial growth of layers may be used. Furthermore, SEG can be followed by epitaxial lateral overgrowth (ELOG), which may allow for improved device manufacturing and device performance.

Growth of Group III-nitride layers are interesting particularly for the manufacturing of power devices and Light Emitting Diode (LED) application and particularly for enhancement mode devices based on GaN technology. Providing a p-doped GaN (p-GaN) layer in the structure of a p-GaN High Electron Mobility Transistor (HEMT) device has, typically, been done by growing a layer of p-GaN on the barrier layer, which is typically an AlGaN layer, followed by patterning and etching of this layer. However, there are difficulties associated with this approach of providing a p-GaN layer. The difficulties arise in etching the p-GaN layer selective to the barrier layer. Additionally, exposure of the surface of the barrier layer in the region between the gate region and the source/drain region, which is typically referred to as the access region, to plasma etch, creates a difficulty to use high temperature dielectric deposition since that region cannot be passivated after the etch step.

This problem can be remedied by the method disclosed in EP 2 602 827 B1. Selective regrowth of p-GaN layer in a recessed gate region is disclosed, where an in-situ grown SiN layer is present having an opening to define the recessed gate region. It is, however, a major challenge to grow p-GaN by selective epitaxy in an opening in the manufacturing of HEMT devices. This is due to the fact that it becomes difficult to control the growth rate and improve the surface morphology of p-GaN layer.

There is, therefore, a need in the art to improve SEG and ELOG (Epitaxial Lateral Over Growth) of Group III-nitride material such that device performance would not be challenged when used in the manufacturing of devices in semiconductor industry.

SUMMARY

Some embodiments may provide an efficient method to allow growth of a layer of Group III-nitride material by SEG (Selective epitaxial growth) that can be easily executed in a manufacturing environment.

Some embodiments may provide an epitaxial grown Group III-nitride material with improved surface morphology.

In a first aspect, the present disclosure relates to a method for forming a layer of a Group III-nitride material. The method comprises providing a structure having a main surface comprising a layer of a first Group III-nitride material. The substrate further comprises, on its main surface, a dielectric layer comprising an opening. This opening exposes the first Group III-nitride material. A thermal treatment process is formed. During this thermal treatment process the substrate is subjected to a gas mixture, thereby increasing temperature of the substrate up to a temperature suitable for growing a layer of a second Group III-nitride material. This gas mixture comprises a nitrogen containing gas. Subsequent to the thermal treatment process, at least one Group III-metal organic precursor is introduced into the gas mixture at the growth temperature, thereby forming, at least in the opening on the exposed first Group III-nitride material, a layer of the second Group III-nitride material by selective epitaxial growth. This gas mixture is free of hydrogen gas.

In some embodiments, the presence of hydrogen gas in the gas mixture may make it difficult to control the growth rate and surface morphology of the Group III-nitride material when grown by SEG (Selective Epitaxial Growth) inside openings comprised in a dielectric layer. The difficulty in controlling the growth rate and surface morphology can, thus, lead to an increase in manufacturing cost. This is due to the fact that it, then, necessitates other processes to be incorporated into the manufacturing process flow to compensate for the resulting Group III-nitride layer grown.

Some embodiments allow for controlled growth of a layer of Group III-nitride material by SEG (Selective Epitaxial Growth) in an opening provided in a dielectric layer.

Some embodiments allow for improved thickness uniformity of a layer of a Group III-nitride material, grown by SEG (Selective Epitaxial Growth), in an opening comprised in a dielectric layer.

Some embodiments allow for improved surface morphology of a layer of Group III-nitride material grown by SEG (Selective Epitaxial Growth) in an opening provided in a dielectric layer.

Some embodiments may reduce the cost of manufacturing since they provide controlled growth with improved thickness uniformity and surface morphology of a layer of Group III-nitride material grown by SEG (Selective Epitaxial Growth) in an opening comprised in a dielectric layer.

Some embodiments allow for enhanced ELOG (Epitaxial Lateral Over Growth) of a layer of a Group III-nitride material.

Some embodiments may provide improved surface morphology of a layer of a Group III-nitride material when ELOG (Epitaxial Lateral Over Growth) is achieved.

In some embodiments, the gas mixture may consist of the nitrogen containing gas and a carrier gas. Using a gas mixture consisting of the nitrogen containing gas and the carrier gas may avoid the formation of pyramidal islands in the opening.

In some embodiments, the nitrogen containing gas may be $NH_3$.

In some embodiments, the carrier gas may be an inert gas such as nitrogen gas or argon.

In some embodiments, the method may further comprise, during the formation of the layer of the second Group III-nitride material, introducing a dopant element into the gas mixture.

Introducing the dopant element into the gas mixture during the formation of the layer may allow for obtaining the layer of the second Group III-nitride material having uniformly distributed dopant profile inside the opening due to the controlled growth. This may also be beneficial for the manufacturing of Group III-nitride devices where such a doped layer of second Group III-nitride material would be desired.

In some embodiments, the dopant element may be a p-type or an n-type.

In some embodiments, this p-type dopant element may be Mg, Be, Zn, Fe, C or combinations thereof.

In some embodiments, this n-type dopant may be Si, Ge, or combinations thereof.

In some embodiments, the layer of the second Group III-nitride material formed may be monocrystalline.

In some embodiments, the method may further comprise introducing hydrogen gas into the gas mixture upon formation of the layer in the opening at the moment the layer and the dielectric layer abut a common planar surface.

Some embodiments may include an introduction of small amount of hydrogen. This may allow for modulating the morphology of selective growth in a controlled manner. Further, this may lead to the formation of a protrusion of the layer bounded by the width of the opening.

In some embodiments, the first Group III-nitride material may be a binary, a ternary or a quaternary Group III-nitride material.

In some embodiments, the binary first Group III-nitride material may be GaN, AlN or InN.

In some embodiments, the ternary first Group III-nitride material may be AlGaN, InGaN or AlInN.

In some embodiments, the quaternary first Group III-nitride material may be InAlGaN.

In some embodiments, the layer of the first Group III-nitride material may be doped with a dopant element.

In some embodiments, this dopant element may be a p-type or an n-type

A doped first Group III-nitride material may allow for optimizing the performance of a Group III-nitride device comprising such a layer of a Group III-nitride material.

In some embodiments, the second Group III-nitride material may be a binary, a ternary or a quaternary Group III-nitride material.

In some embodiments, the binary second Group III-nitride material may be GaN, AlN or InN.

In some embodiments, the ternary second Group III-nitride material may be AlGaN, InGaN or AlInN.

In some embodiments, the quaternary second Group III-nitride material may be InAlGaN.

In some embodiments, the present disclosure relates to a method for manufacturing an enhancement mode Group III-nitride HEMT device. The method may comprise forming the layer of a second Group III-nitride material according to embodiments of the first aspect of the present disclosure wherein the opening may be a gate region. A gate contact may be formed in the gate region to the layer of the second Group III-nitride material and source and drain contacts may be formed through the dielectric layer to the layer of the first Group III-nitride material. The layer of the first Group III-nitride material may extend completely over the main surface and the substrate may further comprise, beneath the layer, a stack of layers, each layer comprising a Group III-nitride material.

In some embodiments, the Group III-nitride material comprised in each layer of the stack of layers may be the same as the first or the second Group III-nitride material with differing compositions.

In some embodiments, the Group III-nitride material comprised in each layer of the stack of layers may also be a combination of the first and the second Group III-nitride material with differing compositions.

In some embodiments, the presence of hydrogen gas in the gas mixture used for the selective epitaxial growth of a Group III-nitride layer in the opening may challenge its device performance. This challenge originates from the surface of the exposed layer of the first Group III-nitride material, being etched, during SEG (Selective Epitaxial Growth), by hydrogen gas present in the gas mixture.

Therefore, some embodiments may allow for manufacturing an enhancement mode Group III-nitride HEMT device having improved device performance.

Furthermore, some embodiments allow for manufacturing an enhancement mode Group III-nitride HEMT device having a Group III-nitride layer in the gate region, with improved growth control, thickness uniformity and surface morphology.

Some embodiments allows for manufacturing an enhancement mode Group III-nitride HEMT device wherein ELOG (Epitaxial Lateral Over Growth) of a layer of a Group III-nitride material is achieved.

Some embodiments allow for manufacturing an enhancement mode Group III-nitride HEMT device wherein ELOG (Epitaxial Lateral Over Growth) of a layer of Group III-nitride material is achieved, thus providing improved device performance, such as increased $V_T$ and $I_{DS}$.

In a second aspect, the present disclosure relates to a Group III-nitride structure. The structure comprises a substrate having a main surface comprising a layer of a first Group III-nitride material. The substrate further comprises, on the main surface, a dielectric layer comprising an opening exposing the first Group III-nitride material. A layer of a second Group III-nitride material is present filling the opening at least partially, thereby having an exposed upper surface. This exposed upper surface is planar and free of grooves.

Some embodiments allow for a Group III-nitride structure for depositing a further layer on the exposed planar upper surface being free of grooves directly, i.e. without the need for using surface flattening process steps, thereby reducing cost of manufacturing.

In some embodiments, the layer of the second Group III-nitride material may be doped with a dopant element.

In some embodiments, the dopant element may be a p-type or an n-type.

In some embodiments, this p-type dopant element may be Mg, Be, Zn, Fe, C or combinations thereof.

In some embodiments, the n-type dopant element may be Si, Ge or combinations thereof.

In some embodiments, the first Group III-nitride material may be a binary, a ternary or a quaternary Group III-nitride material.

In some embodiments, the binary first Group III-nitride material may be GaN, AlN or InN.

In some embodiments, the ternary first Group III-nitride material may be AlGaN, InGaN or AlInN.

In some embodiments, the quaternary first Group III-nitride material may be InAlGaN.

In some embodiments, the second Group III-nitride material may be a binary, a ternary or a quaternary Group III-nitride material.

In some embodiments, the binary second Group III-nitride material may be GaN, AlN or InN.

In some embodiments, the ternary second Group III-nitride material may be AlGaN, InGaN or AlInN.

In some embodiments, the quaternary second Group III-nitride material may be InAlGaN.

In some embodiments, the layer of the second Group III-nitride material may be monocrystalline.

In some embodiments, the layer of the second Group III-nitride material may have a portion protruding from a surface of the dielectric layer, wherein the protruding portion may be bounded within a width w of the opening.

In some embodiments, the protruding portion may have tapered side walls.

In some embodiments, the protruding portion may have a planar upper surface without grooves.

Some embodiments provide a planar upper surface without grooves which may allow for direct deposition of another layer of a material directly on this protrusion, i.e. without the need for another processing step. Furthermore, a layer of a material, which may be desired for a specific application of interest, may be provided by selective deposition on the protruding portion.

In some embodiments, the layer of the second Group III-nitride material at least partially filling the opening may be monocrystalline.

In some embodiments, the present disclosure relates to an enhancement mode Group III-nitride HEMT device. This HEMT device may comprise the structure according to embodiments of the second aspect of the present disclosure, wherein the opening may be a gate region. This HEMT device may further comprise a gate contact formed to the layer of the second Group III-nitride material and source/drain contacts formed through the dielectric layer to the layer of the first Group III-nitride material. The layer of the second Group III-nitride material may extend completely over the main surface. The substrate may further comprise, beneath the layer of the first Group III-nitride material, a stack of layer, each layer comprising a Group III-nitride material.

In some embodiments, such a HEMT device may exhibit better device performance in terms of reduced loading effects and increased $V_T$ and $I_{DS}$.

In some embodiments, the Group III-nitride material comprised in each layer of the stack of layers may be the same as the first or the second Group III-nitride material with differing compositions In some embodiments, the Group III-nitride material comprised in each layer of the stack of layers may also be a combination of the first and the second Group III-nitride material with differing compositions.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

Reference throughout the specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout the specification are not necessarily all referring to the same embodiment, but may. Furthermore, the particular features, structures or characteristics may be combined in any suitable manner, as would be apparent to one of ordinary skill in the art from the disclosure, in one or more embodiments.

Similarly, it should be appreciated that in the description of some embodiments of the disclosure, various features of the disclosure are sometimes grouped together in a single embodiment, figure, or description thereof for the purpose of streamlining the disclosure and aiding in the understanding of one or more of the various inventive aspects. The method of disclosure, however, is not to be interpreted as reflecting an intention that the claims require more features than are expressly recited in each claim. Rather, as the following claims reflect, inventive aspects lie in less than all features of a single foregoing disclosed embodiment. Thus, the claims following the detailed description are hereby expressly incorporated into the detailed description, with each claim standing on its own as a separate embodiment of the disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that some embodiments may be practiced without these specific details. In other instances, well-known methods, structures and techniques have not been shown in detail in order not to obscure an understanding of the description.

The following terms are provided solely to aid in the understanding of the disclosure.

As used herein and unless provided otherwise, the term "access region" refers to the region between a gate region and a source region or between a gate region or a drain region of a HEMT device.

As used herein and unless provided otherwise, the term "exposed" refers to a layer, a surface or a region that is not protected from its surrounding environment.

As used herein and unless provided otherwise, the term "III-nitride" refers to a semiconductor material comprising at least one element from Group III of the periodic table of elements and nitrogen such as for example, GaN, AlN, InGaN, AlGaN, InAlN, InAlGaN.

As used herein and unless provided otherwise, the term "p-type doped GaN layer" refers to a layer comprising GaN and a p-type dopant. The p-type dopant may be Mg, Be, Zn, Fe, C or combinations thereof. The concentration of the p-type dopant may be in the range of 1e17 to 1e21.

As used herein and unless provided otherwise, the term "groove" refers to an indentation in a material that may have linear or rounded side faces or that may be comprised on a surface having concave or convex protrusions.

As used herein and unless provided otherwise, the term "carrier gas" refers to a gas used to supply the nitrogen containing gas into the reaction chamber.

Figure 2A:
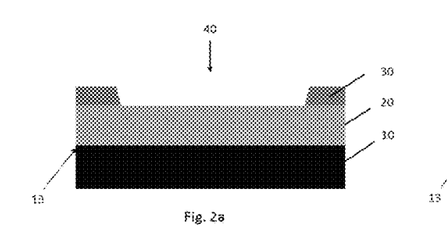
FIG. 2(a) and FIG. 2(b) schematically show formation of a layer of a Group III-Nitride material, according to an example embodiment.
Figure 2B:
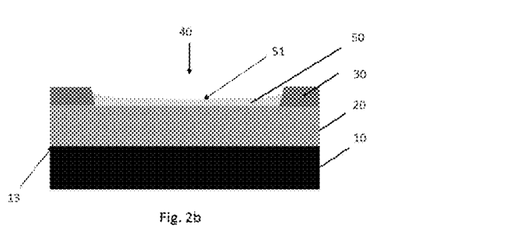

The method according to the first aspect is illustrated schematically in FIG. 2(a) and FIG. 2(b). The figures show corresponding cross-sections of the substrate at different stages of the method. Purely to facilitate understanding, different layers are shown with different numbers, however; this should not be construed in any limiting sense.

We now refer to FIG. 1, FIG. 2(a), FIG. 2(b), FIG. 3(a) and FIG. 3(b).

The method starts with providing a substrate (10) having a main surface (13) (FIG. 2(a)). The main surface (13) comprises a layer (20) of a first Group III-nitride material. The substrate (10) further comprises a dielectric layer (30) comprising an opening (40) exposing at its bottom at least a part of this first Group III-nitride material.

In some embodiments, the substrate (10) may comprise a semiconductor substrate such as a doped silicon substrate, an indium phosphide, a germanium, a silicon germanium, a gallium arsenide, a gallium arsenide phosphide substrate. The substrate may also be a silicon-on-glass, silicon-on-AlN, silicon-on-Mo or a silicon-on-sapphire substrate.

In some embodiments, the substrate (10) may be a silicon substrate. In some embodiments, the substrate may be a Si (111) or an equivalent oriented silicon substrate.

In some embodiments, the dielectric layer may be a silicon oxide or a silicon nitride layer.

In some embodiments, the first Group III-nitride material may be a binary, a ternary or a quaternary Group III-nitride material. This binary first Group III-nitride material may be GaN, AlN or InN while this ternary first Group III-nitride material may be AlGaN, InGaN or AlInN and while this quaternary first Group III-nitride material may be InAlGaN.

In some embodiments, the layer of the first Group III-nitride material may be doped with a dopant element. This may allow for optimization of the device performance. For example, if increase in threshold voltage (Vth) is desired, it may be beneficial to dope with p-type dopant. In contrast, if increased drain current (Ids) is desired, it may be beneficial to dope with n-type dopant.

Figure 3A:
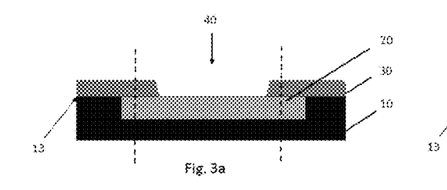
FIG. 3(a) and FIG. 3(b) schematically show examples of the substrate, according to an example embodiment.
Figure 3B:
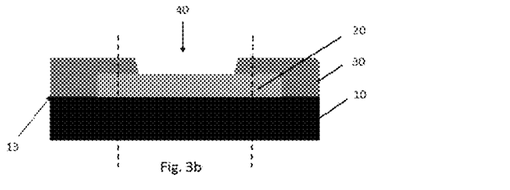

In some embodiments, the substrate may comprise this layer (20) as a buried layer as shown in FIG. 3(a). The surface of the substrate (10) not occupied by the buried layer together with the surface of the layer (20) make up the main surface (13) of the substrate (10). In alternative embodiments, this layer (20) may be present as a patterned feature on the substrate surface, whereby the surface of the substrate (10) not covered by this patterned feature together with the surfaces of the patterned feature make up the main surface (13) of the substrate (10) (FIG. 3(b)). The opening (40) of the dielectric layer (30) may expose at its bottom at least a part of this layer (20) as shown in FIG. 3(a) and FIG. 3(b). Thus, the schematic cross section of the substrate (10) shown in FIG. 2(a) may be a close-up of the cross section of the substrate (10) as indicated by the dotted lines given in FIG. 3(a) and FIG. 3(b).

The substrate (10) is loaded into a reaction chamber of a deposition tool for depositing a layer of a second Group III-nitride material.

In some embodiments, the second Group III-nitride material may be a binary, a ternary or a quaternary Group III-nitride material. This binary second Group III-nitride material may be GaN, AlN or InN while this ternary second Group III-nitride material may be AlGaN, InGaN or AlInN and while this quaternary second Group III-nitride material may be InAlGaN.

The choice of the first and the second Group III-nitride material may be done such that different combinations of binary, ternary and quaternary Group III-nitride materials are possible.

Figure 1:
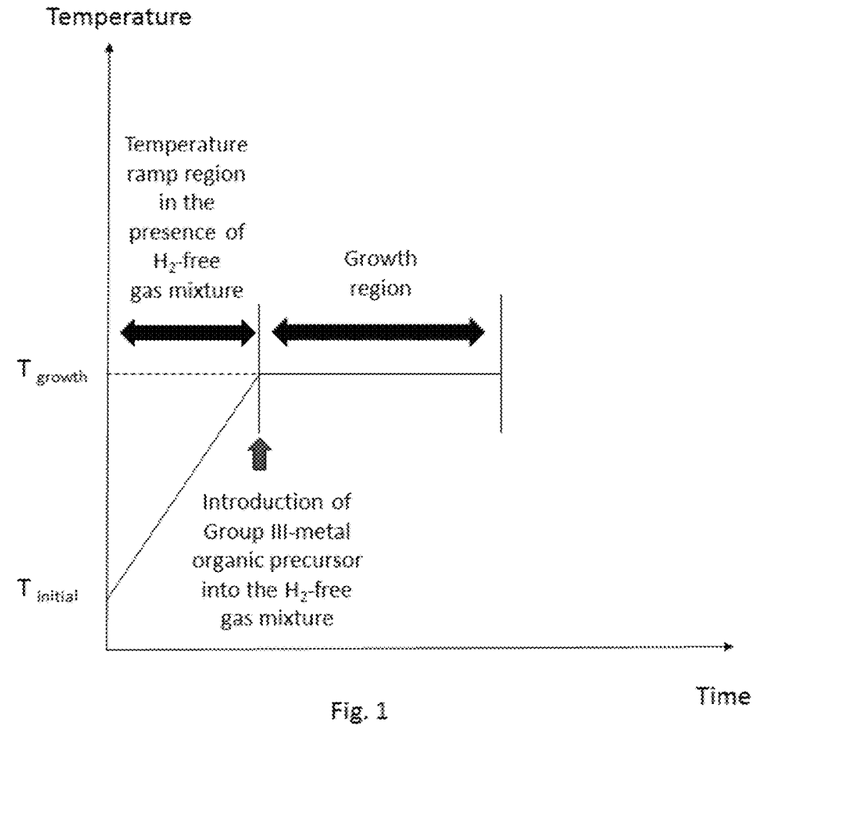
FIG. 1 shows temperature vs. time graph for forming a layer of a Group III-Nitride material, according to an example embodiment.

Before the deposition process starts in the reaction chamber, a thermal treatment process is performed while subjecting the substrate (10) to a gas mixture as schematically shown on the temperature versus time graph of FIG. 1. The purpose of this thermal treatment is to bring the substrate from an ambient temperature present inside the reaction chamber up to a temperature suitable for the growth process to take place. This ambient temperature is denoted as $T_{initial}$ in FIG. 1. This growth temperature ($T_{growth}$) is in the range of 500° C. to 1200° C.

In some embodiments, this gas mixture comprises a nitrogen containing gas. This nitrogen containing gas may be $NH_3$. In some embodiments, this gas mixture may further comprise a carrier gas.

In some embodiments, this gas mixture may consist of a nitrogen containing gas and a carrier gas.

In some embodiments, the carrier gas is used to supply the nitrogen containing gas into the reaction chamber.

In some embodiments, the carrier gas may be an inert gas such as nitrogen gas or argon.

Once a temperature suitable for growing a layer of a second Group III-nitride material ($T_{growth}$) is reached inside the reaction chamber, at least one Group III-metal organic precursor is introduced into the gas mixture (FIG. 1), thereby forming at least in the opening (40) on the exposed first Group III-nitride material, the layer of the second Group III-nitride material (50) by selective epitaxial growth (SEG) (FIG. 2(b)). This at least one Group III-metal organic precursor is in gas phase and is introduced with the help of the carrier gas. Introducing at least one Group III-metal organic precursor leads to the formation of a layer of a binary Group III-nitride material, while introduction of two or three Group III-metal organic precursor leads to the formation of a ternary or a quaternary Group III-nitride material, respectively. In some embodiments, introducing two or three Group III-metal organic precursor may be done sequentially. In some embodiments, introducing two or three Group III-metal organic precursor may be done at the same time.

In some embodiments, the method may further comprise introducing a dopant element into the gas mixture during the formation of the layer comprising the second group III-nitride material. In some embodiments, this introduction may be done simultaneously as with the introduction of the Group III-metal organic precursor. In this way, while the layer (50) is growing the dopant also gets incorporated into the layer (50). This dopant element may in some embodiments, be a p-type or an n-type dopant element. This p-type dopant element may, in some embodiments, be Mg, Be, Zn, Fe, C or combinations thereof. This n-type dopant element, may, in some embodiments, be Si, Ge or combinations thereof. The type of the dopant element is determined by the application. This may be beneficial for the manufacturing of Group III-nitride devices where such a doped layer of second Group III-nitride material would be desired. It allows for obtaining the layer of the second Group III-nitride material having uniformly distributed dopant profile inside the opening thanks to the controlled growth provided by the method. Furthermore, a p-type doped layer of GaN, for example, can be used as the second Group III-nitride material, in order to fully deplete the electrons at the interface between the barrier layer and p-type doped GaN in the manufacturing of enhancement mode HEMT devices, where the barrier layer may, for example, be AlGaN.

In some embodiments, carrying out the thermal treatment process prior to and during the SEG (Selective Epitaxial Growth) process in the presence of this gas mixture that is free of $H_2$ enables the growth of the layer of the second Group III-nitride material, inside the opening (40) such that the grown layer (50) has an upper surface (51) that is planar, or in other words flat, and it is free of grooves (FIG. 2(b)).

Figure 4:
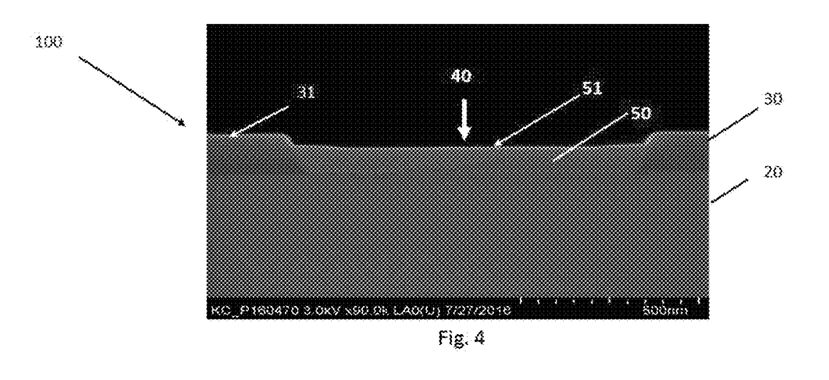
FIG. 4 is a cross section Scanning Electron Microscopy (X-SEM) image of a Group III-nitride structure with a layer of a second Group III-nitride material grown by a method according to an example embodiment.

In an example, this is supported by FIG. 4 showing a X-SEM image of a substrate where, the layer of the second Group III-nitride material (50) is formed by a method according to example embodiments. In this example, the second Group III-nitride material (50) is a p-type doped binary Group III-nitride material. This p-type doped Group III-nitride material is Mg doped GaN. The first Group III-nitride material (20), in this example, is a ternary Group III-nitride material. This first Group III-nitride material is AlGaN.

Figure 5A:
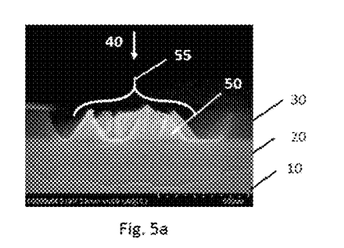
FIG. 5(a) is a cross section Scanning Electron Microscopy (X-SEM) image of a substrate when a gas mixture containing hydrogen gas is used during pre-growth and during growth of a layer of a second Group III-nitride material, according to an example embodiment.
Figure 5B:
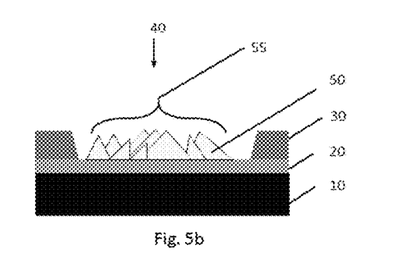
FIG. 5(b) schematically shows the structure of FIG. 5(a).

In an example, FIG. 5(a) shows a X-SEM image and FIG. 5(b) is a schematic representation of a substrate where, the layer comprising the second Group III-nitride material (50) is formed in the opening (40), by SEG (Selective Epitaxial Growth), whereby hydrogen gas is present in the gas mixture. In this example, the formed layer (50) is a Mg doped GaN layer, obtained by using trimethylgallium (TMGa) as the Group III-metal organic precursor. The layer (20) of the first Group III-nitride material is AlGaN, and where the dielectric layer (30) is a silicon nitride.

It is observed that pyramidal islands (55) are formed inside the opening (40). These pyramidal islands create topography inside the opening (40) and a rough surface, combination of which may look like facets or groves having side faces.

Figure 6A:
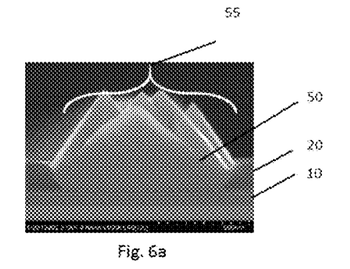
FIG. 6(a) is a cross section Scanning Electron Microscopy (X-SEM) images of a substrate with a layer of a second Group III-nitride material grown when a gas mixture containing hydrogen gas is used during pre-growth and during growth, according to an example embodiment.
Figure 6B:
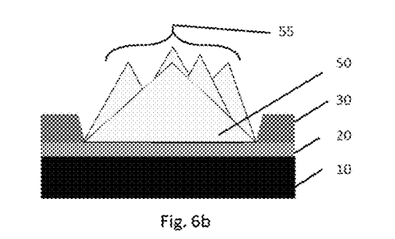
FIG. 6(b) schematically shows the structure of FIG. 6(a).

In another example, FIG. 6(a) shows a X-SEM image and FIG. 6(b) is a schematic representation of a substrate, with the layer (50) similar to that given in FIG. 5(a) and FIG. 5(b). It is observed that pyramidal islands (55) are formed inside the opening (40) that are bigger. It is also observed that these pyramidal island (55) grow over the opening (40) and thus, creating undesirable topography.

Typically, growth of a Group III-nitride layer, for example a layer of GaN, occurs in the presence of a gas mixture containing hydrogen gas when grown on blanket surfaces. This is due to the fact that this presence allows for better surface morphology and less impurities concentration. However, in SEG (Selective Epitaxial Growth), where GaN layer is grown inside an opening (40) in a dielectric layer (30), pyramidal GaN islands (55) were initialized inside the opening (40).

Without wishing to be bound by theory, the formation of such pyramidal islands (55) lies in the presence of $H_2$ gas in the gas mixture. This is due to the fact that $H_2$ gas etches the layer of the first Group III-nitride material (20), which may be AlGaN as in this example of FIG. 5(a), exposed at the bottom of the opening (40). This thus, triggering the formation of such pyramidal islands (55).

Formation of such pyramidal islands (55) makes it very difficult to control the growth rate and to improve the surface morphology of the layer grown inside the opening (40). Furthermore, as the growth proceeds, these islands may grow further and coalesce and protrude from the opening, thus making it difficult to have thickness uniformity of the grown layer inside and/or over the opening (40). This then creates topography on the substrate. Such topography is undesirable in semiconductor manufacturing since it will jeopardize the making of devices. The presence of topography thus necessitates the use of other processes, such as for example chemical mechanical planarization or an etch-back process in order to arrive at a planar surface. Use of such additional processes may have disadvantages due to the fact that it increases manufacturing costs. Thus, using a gas mixture free of $H_2$ gas overcomes the difficulty in controlling the growth rate and improves the surface morphology of the Group III-nitride layer in an opening of a dielectric layer when SEG (Selective Epitaxial Growth) is done. This results in improved thickness uniformity. Thus, this in turn avoids the increase in manufacturing cost since the need for additional surface flattening process would not be present.

Figure 7A:
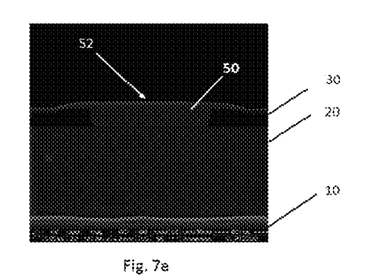
FIG. 7(a) is a cross section Scanning Electron Microscopy (X-SEM) image of a substrate with a layer of a second Group III-nitride material grown by a method according to an example embodiment when ELOG (Epitaxial Lateral Over Growth) occurs.
Figure 7B:
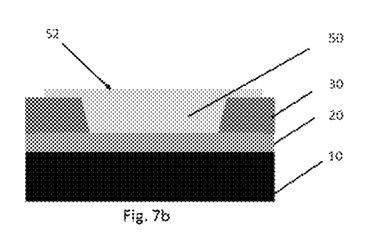
FIG. 7(b) schematically shows the structure of FIG. 7(a).

Some embodiments may lead to the formation of the layer comprising Group III-nitride material (50) also over the dielectric layer (30). This type of formation is referred to as ELOG (Epitaxial Lateral Over Growth) and provides improved surface morphology of the layer (50). ELOG (Epitaxial Lateral Over Growth) of this layer (50) is shown in an example given is FIG. 7(*a*), which is a X-SEM image of a substrate with the layer (50) grown by a method according to an example embodiment when ELOG (Epitaxial Lateral Over Growth) occurs. As shown in FIG. 7(*a*) the upper surface (52) of the layer (50) is planar and without grooves. FIG. 7(*b*) shows schematically the structure of FIG. 7(*a*).

In some embodiments, ELOG (Epitaxial Lateral Over Growth) of p-type or n-type doped Group III-nitride layer may be obtained, leading to improved incorporation of the dopant into the Group III-nitride layer formed both in the opening (40) and over the dielectric (30).

In some embodiments, the method may further comprise introducing hydrogen gas into the gas mixture. This introduction may be done upon formation of the layer (50) comprising the second Group III-nitride material in the opening (40) at the moment that the layer (50) and the dielectric layer (30) abut a common planar surface. This introduction may be done at the moment when the opening (40) is completely filled with the already formed layer of the second Group III-nitride material (50).

Figure 8A:
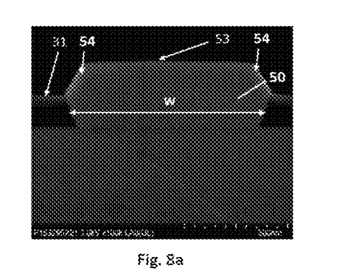
FIG. 8(a) is a cross section Scanning Electron Microscopy (X-SEM) image of a substrate with a layer of a second Group III-nitride material grown by a method according to an example embodiment when hydrogen gas is introduced in the gas mixture upon filling of the opening with the layer of the second Group III-nitride material.
Figure 8B:
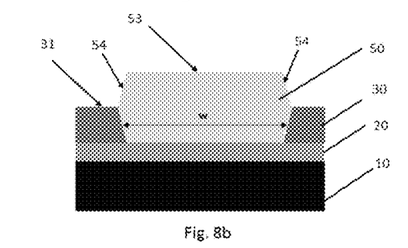
FIG. 8(b) schematically shows the structure of FIG. 8(a).

The introduction of hydrogen gas into the gas mixture enables further controlled growth of the layer (50) of the second Group III-nitride material that leads to formation of the layer extending upward or in other words, protruding from the dielectric layer (30), where the formation is bounded by a width w of the opening (40). This is shown in FIG. 8(*a*) by a X-SEM image of the substrate (10), where the layer (50) is grown uniformly in the opening (40) and the formation of the protruding portion is bounded by the width w of the opening (40). The protruding portion has a planar upper surface (53) free of grooves and tapered sidewalls (FIG. 8(*a*)). FIG. 8(*b*) shows schematically the structure of FIG. 8(*a*).

In this example given by FIG. 8(*a*), the layer (50) is a p-type doped GaN, where the p-type dopant is magnesium. The Group III-nitride metal organic precursor is TMGa.

Without wishing to be bound by theory, even though hydrogen gas is introduced into the gas mixture later in the growth process, the absence of pyramidal islands from the surface (53) of the layer (50) is due to the absence of hydrogen gas during pre-growth and during the growth of the layer (50) in the opening (40). Therefore, introduction of the hydrogen gas at a later stage did not trigger pyramidal island formation. This may also support the fact that pyramidal island formation is due to the etching characteristic of the hydrogen gas on the exposed surface of the layer (20) of the first Group III-nitride material in the opening (40).

The formation of such a protruding portion of the layer (50) may reduce manufacturing cost. For applications where such a structure is desired, the making of it would typically involve a lithographic patterning step. After the lithographic patterning step, the layer has to be etched and a strip process has to be done to remove any etch residues from the substrate (10), thus increasing the cost of manufacturing. Furthermore, the etch process has to be tuned so that the layer (50) can be etched selective to the dielectric layer (30) such that etch damage to the dielectric layer (30) can be avoided, if this would be desired.

For the manufacturing of LED devices, for example, the light extraction efficiency may be improved by the presence of such a protrusion.

In some embodiments, the present disclosure relates to a method for manufacturing an enhancement mode Group III-nitride HEMT device. The method may comprise forming the layer (50) of a second Group III-nitride material according to embodiments of the first aspect of the present disclosure wherein the opening (40) may be a gate region. A gate contact may be formed in the gate region to the layer (50) of the second Group III-nitride material formed and source and drain contacts may be formed through the dielectric layer (30) to the layer of the first Group III-nitride material. The layer (20) of the first Group III-nitride material may extend completely over the main surface (13) and the substrate (10) may further comprise, beneath the layer (20), a stack of layers, where each layer may comprise a Group III-nitride material.

In some embodiments, forming the gate contact may comprise providing a gate metal on the layer (50) in the gate region.

In some embodiments, the Group III-nitride material comprised in each layer of the stack may be a ternary or a binary Group III-nitride material.

In some embodiments, the Group III-nitride material comprised in each layer of the stack may be the same as the first or the second Group III-nitride material with differing compositions.

In some embodiments, the Group III-nitride material comprised in each layer of the stack may also be a combination of the first and the second Group III-nitride material with differing compositions.

In some embodiments, each layer in the stack may be formed by epitaxy. Each layer in the stack may be a multi-layer of a ternary Group III-nitride material or a binary Group III-nitride material or combinations thereof.

In some embodiments, each layer of the stack may have a graded composition.

In some embodiments, the stack of layers may comprise a nucleation layer, a buffer layer, a channel layer and a barrier layer. Of these layers, the buffer layer, the channel layer and the barrier layer are referred to as active layers of the HEMT device.

It may be beneficial to have the buffer layer in the form of a multi-layer when Si is used as the substrate. It helps to build a bow thus building compressive stress in the structure such that upon cooling down the temperature after growing the layer (50) crack formation is avoided.

Manufacturing the enhancement mode group III-nitride HEMT device according to some embodiments may provide better device performance compared to an HEMT device manufactured, where hydrogen gas is used during pre-growth and during growth of the Group III-nitride layer in the gate region. In the absence of hydrogen gas in the gas mixture used during pre-growth and growth of the Group III-nitride layer, etch damage on the surface of the exposed first Group III-nitride material, which may be a barrier layer, is avoided. The fact that etch damage leads to the formation of pyramidal islands and thus, makes it difficult to control the growth inside the opening (40,) the dopant distribution in the opening may be influenced, thereby degrading device performance.

In some embodiments, the Group III-nitride layer may be grown in the opening by SEG (Selective Epitaxial Growth)

according to embodiments of the present disclosure in the manufacturing of the HEMT device.

In alternative embodiments, the layer of Group III-nitride material may be grown by ELOG (Epitaxial Lateral Over Growth) according to embodiments of the present disclosure in the manufacturing of the HEMT device. This may then be followed by lithographic patterning and etch processes in order to have the layer (50) cover the gate region. Furthermore, improved device performance is provided such as for instance increased $V_T$ and $I_{DS}$ and reduced dispersion.

In yet alternative embodiments, the Group III-nitride layer (50) may be grown as that shown in FIG. 8(a) as having the protruding portion according to an example embodiment, which may also be useful in the manufacturing of the III-nitride devices, HEMT or LED devices. Depending on the type of the device to be manufactures and/or the application for which this device is going to be used, a gate metal may be provided only on the upper surface (53) (FIG. 8(b)) or on the tapered sidewalls (54) or both on the upper surface (53) and on the tapered sidewalls (54) (FIG. 8(b)).

In a second aspect, the present disclosure discloses a Group III-nitride structure.

We now refer to FIG. 2(b) that shows schematically a Group III-nitride structure, according to an example embodiment.

The structure comprises a substrate (10) having a main surface (13) comprising a layer (20) of a first Group III-nitride material. The substrate (10) further comprises, on the main surface (13), a dielectric layer (30) comprising an opening (40) exposing the Group III-nitride material. A layer (50) of a second Group III-nitride material is present filling the opening (40) at least partially, thereby having an exposed upper surface (51). This exposed upper surface is planar and free of grooves.

FIG. 4 is a cross section Scanning Electron Microscopy (X-SEM) image of a Group III-nitride structure with a layer of a second Group III-nitride material grown by a method according to an example embodiment.

In some embodiments, for the upper surface to be considered free of grooves, it may have an RMS value of in a range of 0.5 nm and 10 nm. RMS is a representation of surface roughness and is calculated as the Root Mean Square average of peaks and valleys of a materials surface profile. Typically, surface roughness is determined by the so-called Atomic Force Microscopy (AFM) technique.

In some embodiments, the opening (40) may extend from a surface (31) of the dielectric layer (30) to an upper surface of the layer (20) of the first Group III-nitride material. In alternative embodiments, the opening may extend from a surface (31) of the dielectric layer (30) into the layer (20) of the first Group III-nitride material.

In some embodiments, the layer (50) of the second Group III-nitride material may fill the opening completely and may further have a portion protruding from a surface of the dielectric layer, wherein the protruding portion may be bounded within a width w of the opening (40). The protruding portion may have a planar upper surface (53) without grooves and may have tapered side walls (54) (FIG. 8(a) and FIG. 8(b)).

In some embodiments, the layer of the second Group III-nitride material filling the opening may be monocrystalline.

In some embodiments, the layer of the second Group III-nitride material may be doped with a dopant element. This dopant element may be a p-type or an n-type dopant element.

In some embodiments, this p-type dopant element may be Mg, Be, Zn, Fe, C or combinations thereof, while this n-type dopant may be Si, Ge or combinations thereof.

In some embodiments, the first Group III-nitride material may be a binary, a ternary or a quaternary Group III-nitride material. In some embodiments, the binary first Group III-nitride material may be GaN, AlN or InN.

In some embodiments, the ternary first Group III-nitride material may be AlGaN, InGaN or AlInN.

In some embodiments, the quaternary first Group III-nitride material may be InAlGaN.

In some embodiments, the second Group III-nitride material may be a binary, a ternary or a quaternary Group III-nitride material. In some embodiments, the binary second Group III-nitride material may be GaN, AlN or InN.

In some embodiments, the ternary second Group III-nitride material may be AlGaN, InGaN or AlInN.

In some embodiments, the quaternary second Group III-nitride material may be InAlGaN.

Figure 9:
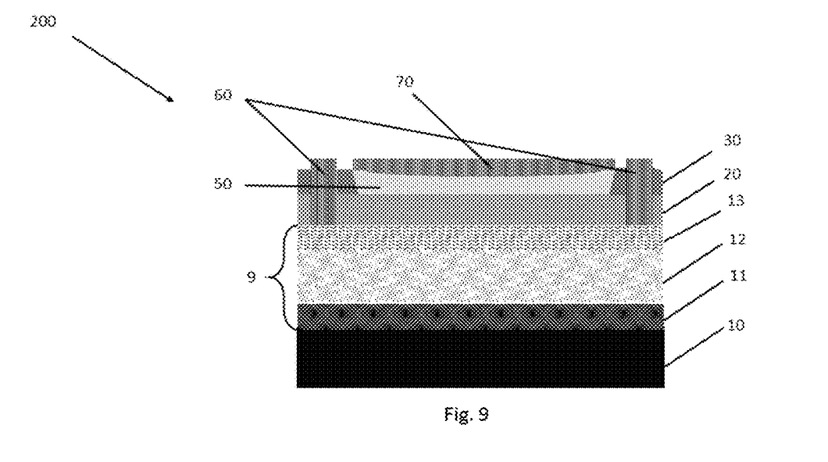
FIG. 9 schematically shows an enhancement mode Group III-nitride HEMT device manufactured, according to an example embodiment.

In some embodiments, the present disclosure relates to an enhancement mode Group III-nitride HEMT device. This HEMT device is schematically shown in FIG. 9.

The HEMT device (200) may comprise the structure (100) according to embodiments of the second aspect of the present disclosure. A gate contact (70) may be formed to the layer (50) of the second Group III-nitride material. In some embodiments, the gate contact may comprise a gate metal on the layer (50) in the gate region.

Source and drain contacts (60) may be formed through the dielectric layer (30) to the layer of the first Group III-nitride material. The layer (50) of the second Group III-nitride material may extend completely over the main surface (13) of the substrate (10) and the substrate (10) may, further comprise, beneath the layer (20) of the first Group III-nitride material, a stack of layers (9). Each layer of the stack (9) may comprise a Group III-nitride material.

In some embodiments, each layer in the stack may be formed by epitaxy.

In some embodiments, the Group III-nitride material comprised in each layer of the stack (9) may be the same as the first or the second Group III-nitride material of the layer (20) or the layer (50), respectively, but with differing compositions.

In some embodiments, each layer of the stack (9) may comprise a ternary Group III-nitride material or a binary Group III-nitride material.

In some embodiments, each layer in the stack (9) may be a multi-layer comprising a ternary Group III-nitride material or a binary Group III-nitride material or combinations thereof.

In some embodiments, each layer of the stack may have a graded composition.

In some embodiments, the Group III-nitride material comprised in each layer of the stack (9) may also be a combination of the first and the second Group III-nitride material with differing compositions.

In some embodiments, each layer in the stack (9) may be formed by epitaxy. Each layer in the stack (9) may be a multi-layer or a layer having a graded composition.

In some embodiments, the stack (9) of layers may comprise a nucleation layer (11), a buffer layer (12), and a channel layer (13). Of these layers, the buffer layer (13), the channel layer (13) together with the layer of the first Group III-nitride material (20), which is the barrier layer, are referred to as active layers of the HEMT device.

It may be beneficial to have the buffer layer in the form of a multi-layer when Si is used as the substrate. It may help in providing a bow thus, making the HEMT device have compressive stress such that upon cooling down the temperature after growing the layer (50) crack formation is avoided.

Some embodiments may allow for the manufacture of power devices such as enhancement mode High Electron Mobility Transistor (HEMT) as well as Light Emitting Diode (LED). It also allows the manufacture of devices suitable for radio frequency (RF) applications.

Such devices may provide for (i) lower dispersion, (ii), increased VT and IDS, (iii) controlled shape of protrusion, and (iv) light extraction efficiency for the LED.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a layer of a Group III-Nitride material comprising:
    providing a substrate having a main surface comprising a layer of a first Group III-nitride material, the substrate further comprising, on the main surface, a dielectric layer comprising an opening exposing the first Group III-nitride material;
    performing a thermal treatment process while subjecting the substrate to a gas mixture comprising a nitrogen containing gas, thereby increasing temperature of the substrate up to a temperature for growing a layer of a second Group III-nitride material;
    introducing, subsequently, at least one Group III-metal organic precursor gas into the gas mixture at the temperature for growing, thereby forming, at least in the opening on the exposed first Group III-nitride material, a layer of the second Group III-nitride material by selective epitaxial growth, wherein the gas mixture is free of hydrogen gas; and
    upon formation of the layer in the opening at a moment the layer and the dielectric layer abut a common planar surface, introducing $H_2$ gas to the gas mixture.

2. The method according to claim 1, wherein the gas mixture consists of the nitrogen containing gas and a carrier gas.

3. The method according to claim 1, wherein the method further comprises, during the formation of the layer of the second Group III-nitride material, introducing, into the gas mixture, a dopant element.

4. The method according to claim 3, wherein the dopant element is a p-type or an n-type.

5. The method according to claim 1, wherein the first Group III-nitride material is a binary, a ternary, or a quaternary Group III-nitride material.

6. The method according to claim 1, wherein the second Group III-nitride material is a binary, a ternary, or quaternary Group III-nitride material.

7. A method for manufacturing an enhancement mode Group III-nitride HEMT device, the method comprising:
    forming a layer of a second Group III-nitride material according to claim 1, wherein the opening is a gate region;
    forming, in the gate region, a gate contact to the layer of the second Group III-nitride material; and
    forming, source/drain contacts, through the dielectric layer, to the layer of the first Group III-nitride material, wherein the layer of the first Group III-nitride material extends completely over the main surface and wherein the substrate further comprises, beneath the layer, a stack of layers, each layer comprising a Group III-nitride material.

* * * * *